(12) United States Patent
Chang et al.

(10) Patent No.: US 9,837,384 B2
(45) Date of Patent: Dec. 5, 2017

(54) FAN-OUT MULTI-CHIP PACKAGE WITH PLURALITY OF CHIPS STACKED IN STAGGERED STACK ARRANGEMENT

(71) Applicant: POWERTECH TECHNOLOGY INC., Hsinchu (TW)

(72) Inventors: Chia-Wei Chang, Hsinchu (TW); Kuo-Ting Lin, Hsinchu (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 15/245,653

(22) Filed: Aug. 24, 2016

(65) Prior Publication Data
US 2017/0194293 A1    Jul. 6, 2017

(30) Foreign Application Priority Data
Dec. 31, 2015 (TW) .............................. 104144776 A (51) Int. Cl.
*H01L 25/065* (2006.01)
*H01L 21/56* (2006.01)
(Continued)

(52) U.S. Cl.
CPC ...... *H01L 25/0657* (2013.01); *H01L 21/4817* (2013.01); *H01L 21/4853* (2013.01); *H01L 21/561* (2013.01); *H01L 21/568* (2013.01); *H01L 21/6835* (2013.01); *H01L 21/78* (2013.01); *H01L 23/04* (2013.01); *H01L 23/3128* (2013.01); *H01L 24/32* (2013.01); *H01L 24/49* (2013.01); *H01L 24/73* (2013.01); *H01L 24/83* (2013.01); *H01L 24/85* (2013.01); *H01L 24/92* (2013.01); *H01L 24/96* (2013.01); *H01L 24/97* (2013.01); *H01L 25/50* (2013.01); *H01L 2221/68345* (2013.01); *H01L 2221/68359* (2013.01); *H01L 2224/0239* (2013.01);
(Continued)

(58) Field of Classification Search
CPC ......... H01L 21/56; H01L 24/42; H01L 24/82; H01L 24/96; H01L 25/0657; H01L 25/25; H01L 25/50
See application file for complete search history.

(56) References Cited

U.S. PATENT DOCUMENTS

9,412,722 B1 *    8/2016    Lin .................... H01L 25/0657
2008/0054432 A1 * 3/2008    Corisis ............. H01L 23/49506
                                                            257/686
(Continued)

*Primary Examiner* — Thanh V Pham
(74) *Attorney, Agent, or Firm* — JCIPRNET (57) ABSTRACT

A fan-out multi-chip package has a first redistribution layer and a plurality of chips encapsulated in an encapsulant. A dielectric layer and a second redistribution layer are formed on the encapsulant. A bottom surface of the encapsulant is formed when forming the encapsulant. The first redistribution layer has a plurality of connecting surfaces exposed on the bottom surface of the encapsulant. The dielectric layer is formed on the bottom surface of the encapsulant without covering the connecting surfaces. The second redistribution layer includes a plurality of bump pads coupled to the connecting surfaces. The fan-out circuitry is covered by the dielectric layer. Thereby, a multi-chip package is able to reduce possible damages to the active surfaces and bonding pads of the chips during packaging process.

10 Claims, 6 Drawing Sheets

(51) Int. Cl.

| | | |
|---|---|---|
| *H01L 21/48* | (2006.01) | |
| *H01L 21/683* | (2006.01) | |
| *H01L 21/78* | (2006.01) | |
| *H01L 23/04* | (2006.01) | |
| *H01L 23/31* | (2006.01) | |
| *H01L 23/00* | (2006.01) | |
| *H01L 25/00* | (2006.01) | |

(52) U.S. Cl.
CPC ......... *H01L 2224/04042* (2013.01); *H01L 2224/04105* (2013.01); *H01L 2224/06179* (2013.01); *H01L 2224/12105* (2013.01); *H01L 2224/32145* (2013.01); *H01L 2224/48091* (2013.01); *H01L 2224/48106* (2013.01); *H01L 2224/48227* (2013.01); *H01L 2224/73265* (2013.01); *H01L 2224/73267* (2013.01); *H01L 2224/92247* (2013.01); *H01L 2225/0651* (2013.01); *H01L 2225/06541* (2013.01); *H01L 2225/06562* (2013.01); *H01L 2924/01022* (2013.01); *H01L 2924/01028* (2013.01); *H01L 2924/01029* (2013.01); *H01L 2924/01079* (2013.01); *H01L 2924/07025* (2013.01); *H01L 2924/15311* (2013.01)

(56) References Cited

U.S. PATENT DOCUMENTS

| | | | |
|---|---|---|---|
| 2011/0147911 A1* | 6/2011 | Kohl | H01L 21/6835 257/686 |
| 2012/0068338 A1* | 3/2012 | Haba | H01L 23/3128 257/738 |
| 2012/0313228 A1* | 12/2012 | Haba | H01L 23/3128 257/668 |
| 2016/0190046 A1* | 6/2016 | Fontana | H01L 23/3114 257/676 |
| 2017/0011827 A1* | 1/2017 | Miyauchi | C03C 3/089 |
| 2017/0012031 A1* | 1/2017 | Lim | H01L 25/18 |
| 2017/0110439 A1* | 4/2017 | Yuan | H01L 24/03 |
| 2017/0133351 A1* | 5/2017 | Su | H01L 25/50 |

* cited by examiner

FAN-OUT MULTI-CHIP PACKAGE WITH PLURALITY OF CHIPS STACKED IN STAGGERED STACK ARRANGEMENT

CROSS-REFERENCE TO RELATED APPLICATION

This application claims the priority benefit of Taiwan application serial no. 104144776, filed on Dec. 31, 2015. The entirety of the above-mentioned patent application is hereby incorporated by reference herein and made a part of this specification.

FIELD OF THE INVENTION

The present invention relates to a semiconductor package structure and more specifically to a fan-out multi-chip package and its fabricating method.

BACKGROUND OF THE INVENTION

Portable electronic devices such as smart phones, smart pads, or smart bracelets are popular nowadays and are being developed to have thinner dimensions, higher capacities, and more functions. Printed circuit boards are implemented as chip carriers in early semiconductor integrated circuit flip-chip packages. However, redistribution layers (RDL) have replaced the conventional printed circuit boards in wafer-level and panel-level fan-out packages. Wafer-level and panel-level temporary carriers are used during molding process. In this way, substrates are eliminated to further reduce package thickness.

A fan-out chip package have two different structures: active surface facing down toward the temporary carrier during molding process and active surface facing away from the temporary carrier during molding process. During the fan-out chip packaging process with active surface facing down, the active surface of the fan-out chip package is attached to the temporary carrier which is very difficult for multi-chip packaging. After molding processes, the temporary carrier is peeled off to expose the active surfaces of the chips, the redistribution layer is formed on the encapsulant and the active surfaces of the chips to directly connect to the bond pads of the chips. However, bond pads are easily damaged due to cleaning the contaminations disposed on the bond pads of the chips. Furthermore, during the fabrication processes of fan-out chip packages with active surfaces facing up, bumps are pre-formed on the wafers, singulated to form a plurality of individual bumped dice, attached the back surfaces of the chips to the temporary carrier, formed the encapsulant by molding processes, exposed the connecting surfaces of the bumps by grinding, formed the redistribution layer on the encapsulant to connect to the connecting surfaces of the bumps. However, the active surfaces of the chips may be damaged during grinding processes.

SUMMARY OF THE INVENTION

The main purpose of the present invention is to provide a fan-out multi-chip package and its fabricating method to achieve thin multi-chip packages and reduce the damages to bond pads and active surfaces of the chips.

An embodiment of the present invention presents a structure of a fan-out multi-chip package, the fan-out multi-chip package comprises a plurality of chips stacked on each other in a staggered stack arrangement, a first redistribution layer formed on a periphery of the plurality of chips, an encapsulant formed to encapsulate the plurality of chips and the first redistribution layer, a second redistribution layer formed on a carrier plane, and a dielectric layer formed on the carrier plane and configured to cover the second redistribution layer. The first redistribution layer has a plurality of first connecting points electrically connected to the plurality of chips and a plurality of connecting surfaces. The encapsulant has a bottom surface. The bottom surface, the plurality of connecting surfaces of the first redistribution layer, and a back surface of one of the plurality of chips are coplanar to each other and forms the carrier plane. The second redistribution layer is electrically connected to the first redistribution layer Another embodiment of the present invention presents a fabricating method of a fan-out multi-chip package. The method comprises providing a temporary carrier having a carrier plane, forming a first redistribution layer on the carrier plane of the temporary carrier, stacking a plurality of chips on carrier plane of the temporary carrier in a staggered stack arrangement, forming an encapsulant on the carrier plane to encapsulate the chips and the first redistribution layer, removing the temporary carrier to expose connecting surfaces of the first redistribution layer, the bottom surface of the encapsulant and a back surface of the chips, and forming a dielectric layer and a second redistribution layer on the bottom surface of the encapsulant. The first redistribution layer has a plurality of first connecting points. The plurality of chips are electrically connected to the plurality of first connecting points. The encapsulant has a bottom surface defined by the carrier plane. The bottom surface, the plurality of connecting surfaces of the first redistribution layer, and a back surface of one of the plurality of chips are coplanar to each other. The second redistribution layer is electrically connected to the first redistribution layer. And, the dielectric layer is configured to cover the second redistribution layer.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios may be selectively designed and disposed and the detail component layouts may be more complicated.

Figure 1:
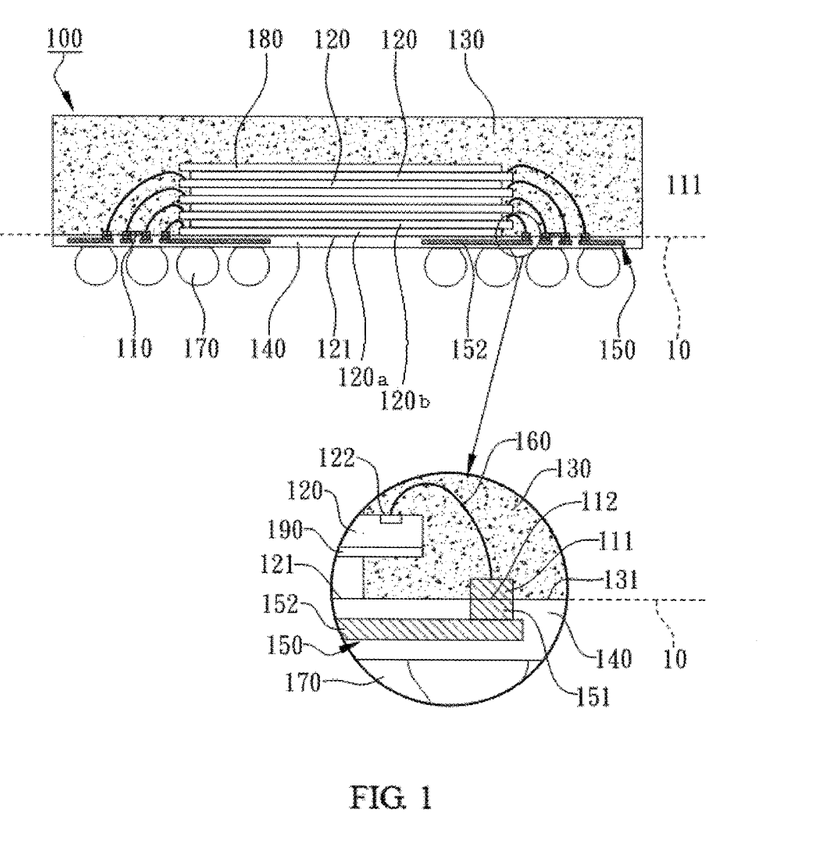
FIG. 1 illustrates a cross-sectional view of a fan-out multi-chip package according to an embodiment of the present invention.

FIG. 1 illustrates a cross-sectional view of a fan-out multi-chip package 100 according to an embodiment of the present invention. A fan-out multi-chip package 100 comprises a first redistribution layer 110, a plurality of chips 120, an encapsulant 130, a dielectric layer 140 and a second redistribution layer 150.

The first redistribution layer 110 may be an internal circuit encapsulted inside the encapsulant 130. The second redistribution layer 150 is an external circuit disposed on the encapsulant 130. The dividing plane between the first redistribution layer 110 and the second redistribution layer 150 is a carrier plane 10. The first redistribution layer 110 and the second redistribution layer 150 are composite metal layers fabricated through integrated circuit fabrication process. The composite metal layers may include at least one conductive layer of copper. The thickness of the at least one conductive layer of copper may approximately be 3 micrometer (μm). An adhesive layer made from conductive material such as titanium (Ti) having a thickness of 0.1 μm and a seed layer made from conductive material such as Copper (Cu) having a thickness of 0.2 μm are disposed at the bottom of the major conductive layer of Copper. A layer of Nickel (Ni)-Gold (Au) may be formed on top of the major conductive layer to enhance the anti-corrosion and soldering capability of the first redistribution layer 110 and the second redistribution layer 150. The Nickel (Ni) may have a thickness of 2 μm and the Gold (Au) may have a thickness of 0.3 μm. Therefore, the first redistribution layer 110 and the second redistribution layer 150 do not need electroplated circuit for electrical coupling. The first redistribution layer 110 and the second redistribution layer 150 are formed opposite to each other. The first redistribution layer 110 and the second redistribution layer 150 are formed through deposition process and/or electroplating process. The adhesive layer and the seed layer of the first redistribution layer 110 and the adhesive layer and the seed layer of the second redistribution layer 150 are close to each other.

As shown in FIG. 1, the first redistribution layer 110 includes a plurality of first connecting points 111 and a plurality of connecting surfaces 112. The first redistribution layer 110 is formed on the carrier plane 10. The first connecting points 111 may be bonding studs. The connecting surfaces 112 may be terminals of the first connecting points 111. The chips 120 are stacked on the carrier plane 10 and are electrically connected to corresponding first connecting points 111. The chips 120 are semiconductor components having integrated circuit formed on the active surfaces. Each of the chips 120 uses a plurality of bond pads 122 as connecting terminals. The chips 120 are disposed in a staggered stack arrangement for convenience during the wire bonding process. In the staggered stack arrangement, a first chip 120a is adjacent to a second chip 120b with the second chip 120b being laterally displaced from the first chip 120a. The second chip 120b being stacked on the active surface of the first chip 120a without having the second chip 120b cover the bond pads 122 of the first chip 120a. In some embodiments, the fan-out multi-chip package 100 may have a plurality of first chips 120a and a plurality of second chips 120b. The plurality of first chips 120a and the plurality of second chips 120b may be stacked to be alternating from one another. The plurality of first chips 120a may be vertically aligned to each other. And, the plurality of second chips 120b may be vertically aligned to each other. When a first chip 120a is stacked on top of a second chip 120b, the bond pads 122 of the second chip 120b may not be covered by the first chip 120a. When a second chip 120b is stacked on top of a first chip 120a, the bond pads 122 of the first chip 120a may not be covered the second chip 120b. Thus, the staggered stack arrangement of the chips 120 may have double-side shifting displacement, four-side shifting displacement, or single-side shifting displacement. Furthermore, the plurality of chips 120 may have a bottom chip disposed to be on the same plane as the first redistribution layer 110. The bottom chip is disposed to have a back surface disposed on the carrier plane 10. The remaining chips of the plurality of chips 120 are stacked on an active surface of the bottom chip. The active surface of the bottom chip is opposite to the back surface of the bottom chip.

The fan-out multi-chip package 100 may further comprise a plurality of metal wires 160 configured to electrically connect a plurality of bond pads 122 of the chips 120 to the first connecting points 111. The plurality of metal wires 160 may be gold wires and may be formed through wire bonding process. The chips 120 and the first connecting points 111 may be encapsulated inside the encapsulant 130. The first connecting points 111 are disposed on the periphery of the chips 120. Thus, the first redistribution layer 110 is formed to surround the chips 120. In some other embodiments, the chips 120 are electrically coupled to the first connecting points 111 through inner leads, metal pillars, or Through Mold Vias (TMV).

The fan-out multi-chip package 100 may further comprise a protective plate 180 disposed on an active surface of a top chip of the plurality of chips 120. The top chip may be a chip of the plurality of chips 120 stacked farthest from the bottom chip. The protective plate 180 may be a dummy chip, a metal plate, or a tape. The thickness of the protective plate 180 may be approximately the same as the thickness of a chip 120. In this way, the active surface of the top chip of the plurality of chips 120 is protected and not exposed to the encapsulant 130.

In some embodiments, a die attach layer 190 may be disposed between two adjacent chips 120 to adhere the chips 120 to each other. Each of a plurality of die attach layers 190 may be disposed between two chips 120. The bottom chip 120 of the plurality of chips 120 may be directly adhered to the dielectric layer 140 to reduce package thickness.

The encapsulant 130 is formed on the carrier plane 10 to encapsulate the chips 120 and the first connecting points 111. The encapsulant 130 may be an Epoxy Molding Compound (EMC) that is thermosetting and may as an electrical insulator. The encapsulant 130 has a bottom surface 131 formed according to the carrier plane 10. The plurality of connecting surfaces 112 of the first redistribution layer 110 may be exposed at the bottom surface 131.

The dielectric layer 140 may be formed on the bottom surface 131 of the encapsulant 130 and may have recessed areas configured to expose the connecting surfaces 112. The dielectric layer 140 includes a plurality of organic passivation layers. The plurality of organic passivation layers may be formed using vapor deposition, spin coating, or printing process. The material used to form the organic passivation layers may be a Polyimide (PI). The thickness of each of the organic passivation layers may range from 3 μm to 20 μm. In an exemplary embodiment, the thickness of an organic passivation layer may be approximately 5 μm.

The second redistribution layer 150 is formed on the bottom surface of the encapsulant 130. The second redistribution layer 150 includes a plurality of second connecting points 151 and a fan-out circuitry 152. The second connecting points 151 are coupled to the connecting surfaces 112. The fan-out circuitry 152 may be covered by the dielectric layer 140. In an exemplary embodiment, the second connecting points 151 may be bump pads.

The connecting surfaces 112, the bottom surface 131 of the encapsulant 130, and a back surface 121 of bottom chip of the plurality of chips 120 may be coplanar to each other. And, the dielectric layer 140 may be formed in the said coplanar surfaces to enhance electrical insulation for the fan-out multi-chip package 100. The back surface 121 of bottom chip of the plurality of chips 120 may not be covered by the encapsulant 130. In this way, the fan-out multi-chip package 100 presented may reduce the possible damages to active surfaces and the bond pads 122 of the chips 120 and reduce the thickness of the entire package as compared to conventional multi-chip package.

Furthermore, the fan-out multi-chip package 100 further comprises a plurality of solder balls 170 protruding from the dielectric layer 140. The plurality of solder balls 170 may be electrically connected to the fan-out circuitry 152 of the second redistribution layer 150 to form a substrateless multi-chip ball grid array packages.

FIGS. 2A to 2H illustrate cross-sectional views of the fan-out multi-chip package in FIG. 1 during each step of the fabricating process. FIG. 3 illustrates a flowchart of a method of fabricating the fan-out multi-chip package 100 in FIG. 1. The method of fabricating the fan-out multi-chip package 100 may include, but is not limited to, the following step:

Step 301: providing a temporary carrier;
Step 302: forming a first redistribution layer on a carrier plane of the temporary carrier;
Step 303: stacking a plurality of chips on the carrier plane;
Step 304: forming an encapsulant on the carrier plane;
Step 305: debonding the temporary carrier;
Step 306: forming a dielectric layer and a second redistribution layer on a bottom surface of the encapsulant;
Step 307: disposing a plurality of solder balls on the second redistribution layer; and
Step 308: performing singulation process to form a plurality of individual fan-out multi-chip packages.

Figure 2A:
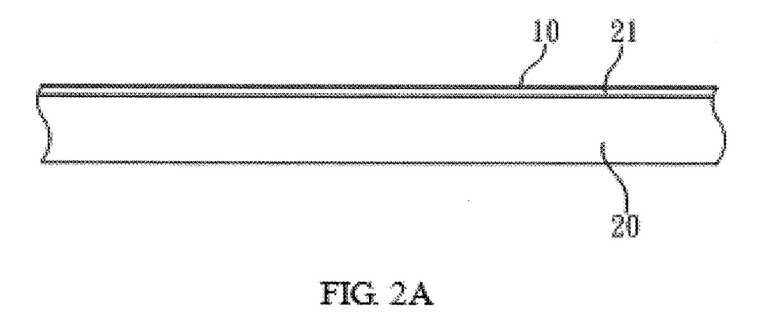
FIGS. 2A to 2H illustrate cross-sectional views of the fan-out multi-chip package in FIG. 1 during each step of the fabricating process.
Figure 3:
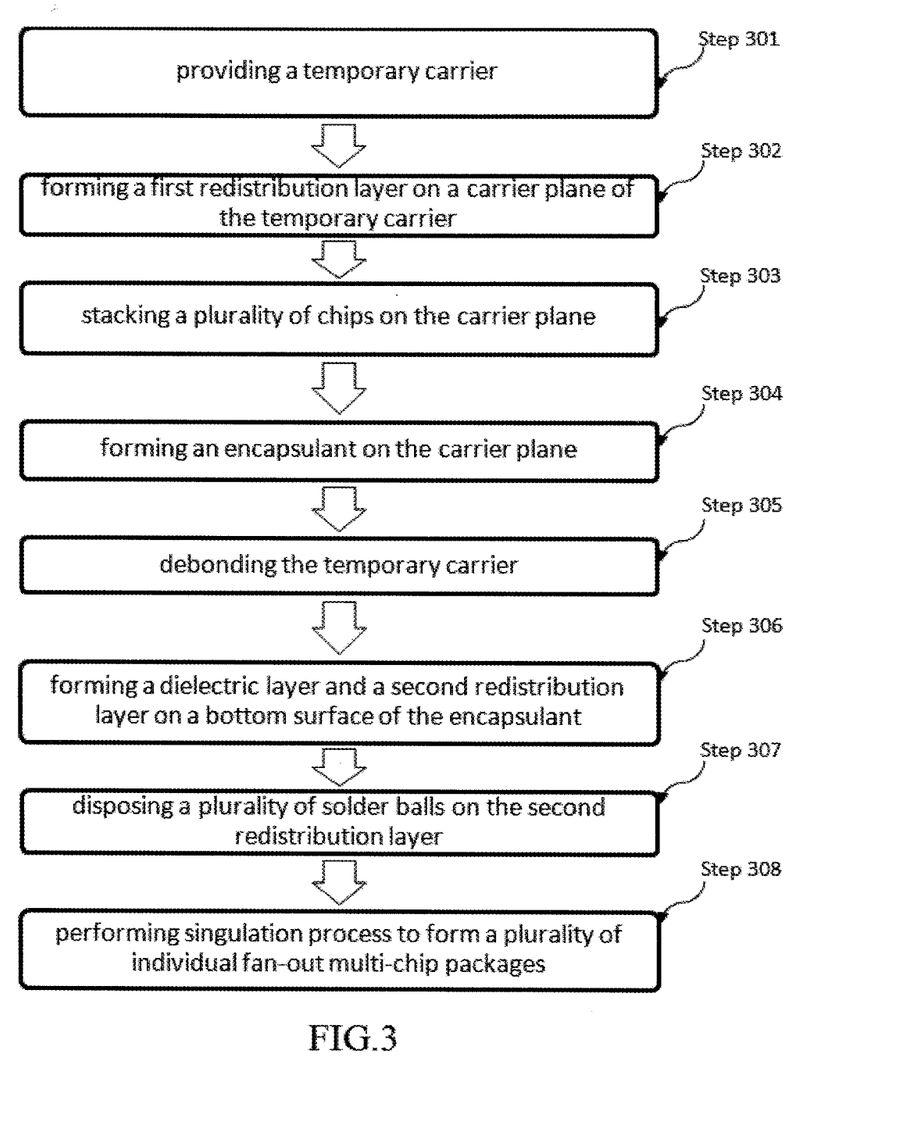
FIG. 3 illustrates a flowchart of a method of fabricating the fan-out multi-chip package in FIG. 1.

As shown in FIG. 2A, a temporary carrier 20 is provided. The temporary carrier 20 may be a wafer-level carrier or a panel-level carrier. In an exemplary embodiment, the temporary carrier 20 may be a 12 inch glass wafer. An adhesive layer 21 is formed on the surface of the temporary carrier 20. In this way, the temporary carrier may be debonded fan-out multi-chip package 100 after the fabrication process. The adhesive property of the adhesive layer 21 may eliminated through exposure to UV radiation.

Figure 2B:
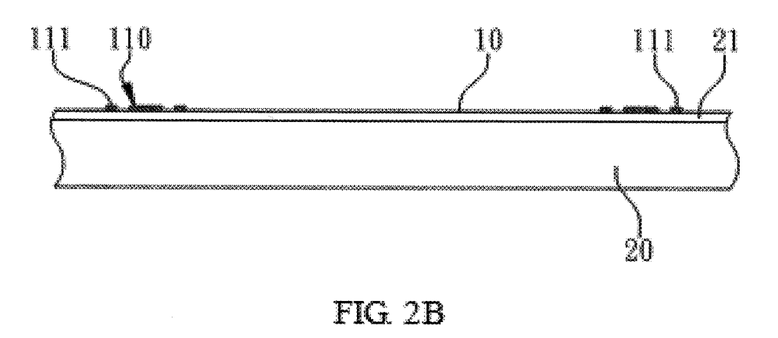

As shown in FIG. 2B, a first redistribution layer 110 is formed on the carrier plane 10 of the temporary carrier 20 through an IC fabrication processes. The first redistribution layer 110 includes a plurality of first connecting points 111.

Figure 2C:
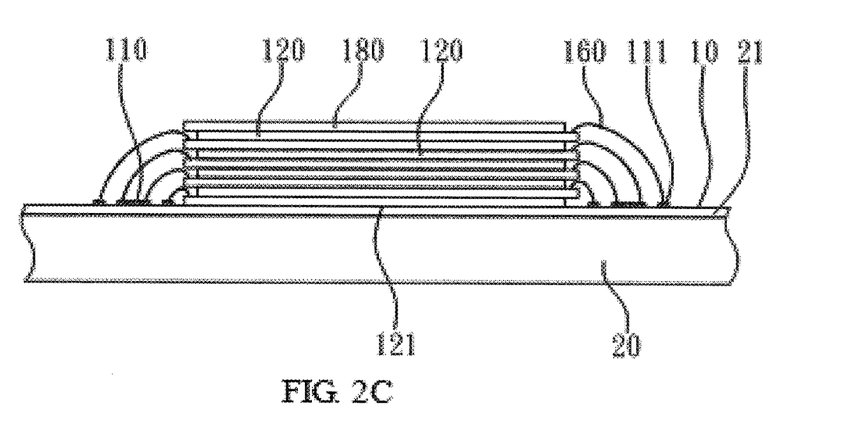

As shown in FIG. 2C, a plurality of chips 120 are stacked on the carrier plane 10 through a pick-and-place process. A plurality of metal wires 160 are formed through a wire bonding process to electrically connect the chips 120 to the first connecting points 111. A protective plate 180 may be disposed on an active surface of a top chip of the plurality of chips 120. The chips are stacked on each other in a staggered stack arrangement. The above-mentioned pick-and-place process and the wire bonding processes are interchangeable from each other during the fabrication process.

Figure 2D:
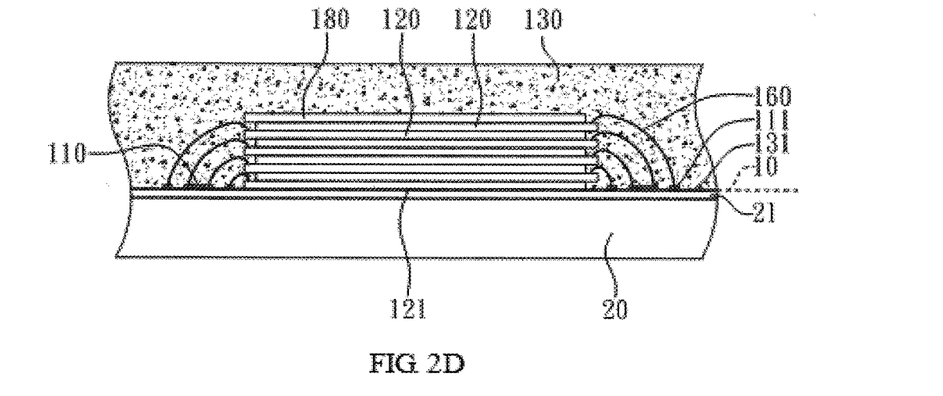

As shown in FIG. 2D, an encapsulant 130 is formed on the carrier plane 10 through wafer-level molding process or panel-level molding process. The encapsulant 130 may encapsulate the chips 120 and the first connecting points 111. The thickness of the encapsulant 130 may be reduced though a wafer-level grinding process or panel-level grinding process.

Figure 2E:
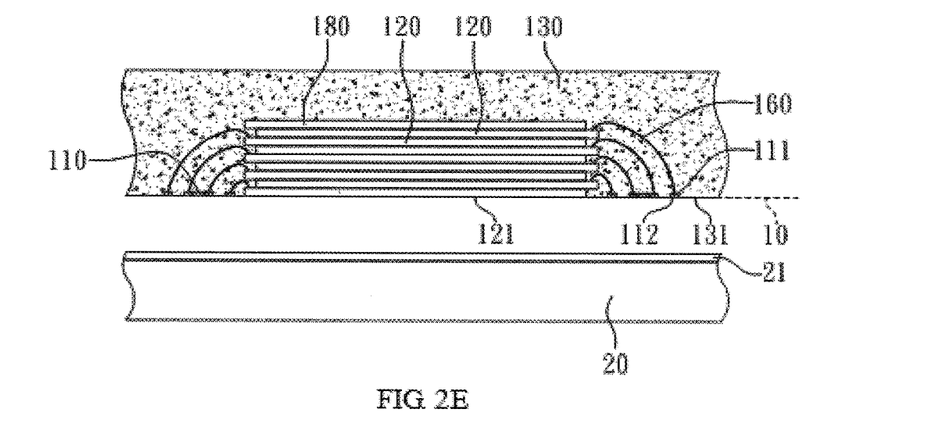

As shown in FIG. 2E, the encapsulant 130 is debonded from the temporary carrier 20. The adhesive property of the adhesive layer 21 is eliminated by exposing the adhesive layer 21 to ultra violet (UV) radiation. In this way, the bottom surface 131 of the encapsulant 130 defined by the carrier plane 10 is exposed. The first redistribution layer 110 has a plurality of connecting surfaces 112 exposed on the bottom surface 131 of the encapsulant 130. The back surface 121 of the bottom chip 120 may be exposed on the bottom surface 131 of the encapsulant 130. Therein, the connecting surfaces 112, the bottom surface 131 of the encapsulant 130 and the back surface 121 of the chips 120 are coplanar to each other. Each of the connecting surfaces 112 corresponds to a first connecting point 111.

Figure 2F:
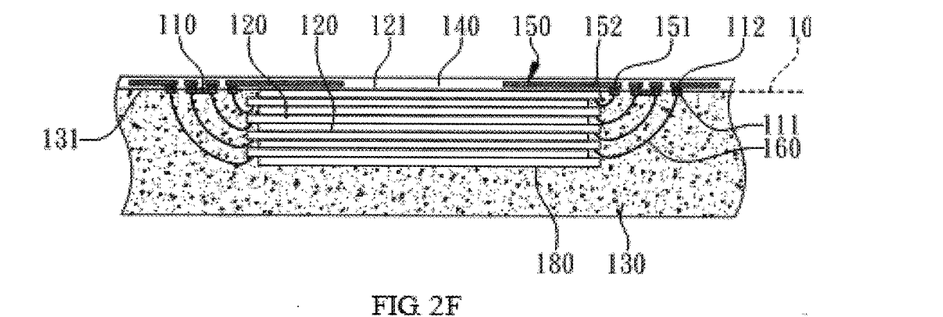

As shown in FIG. 2F, a dielectric layer 140 and a second redistribution layer 150 are formed on the bottom surface 131 of the encapsulant 130. The dielectric layer 140 may have recessed areas configured to expose the connecting surfaces 112. The second redistribution layer 150 includes a plurality of second connecting points 151 and a fan-out circuitry 152. The second connecting points 151 may electrically connect to the connecting surfaces 112. The fan-out circuitry 152 is covered by the dielectric layer 140. Furthermore, the dielectric layer 140 may cover the back surfaces 121 of the chips 120.

Figure 2G:
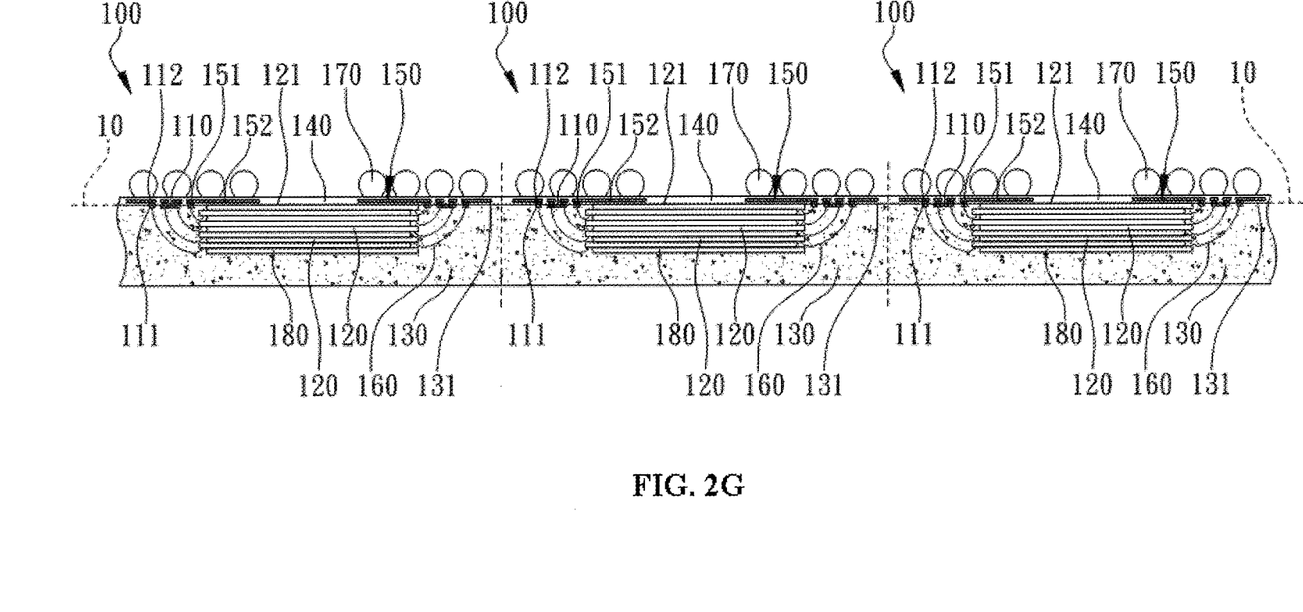

As shown in FIG. 2G, a plurality of solder balls 170 are disposed on the second redistribution layer 150 through ball placement process and reflow process. The solder balls 170 may be protruding from the dielectric layer 140 and may be electrically connected to the fan-out circuitry 152 of the second redistribution layer 150.

Figure 2H:
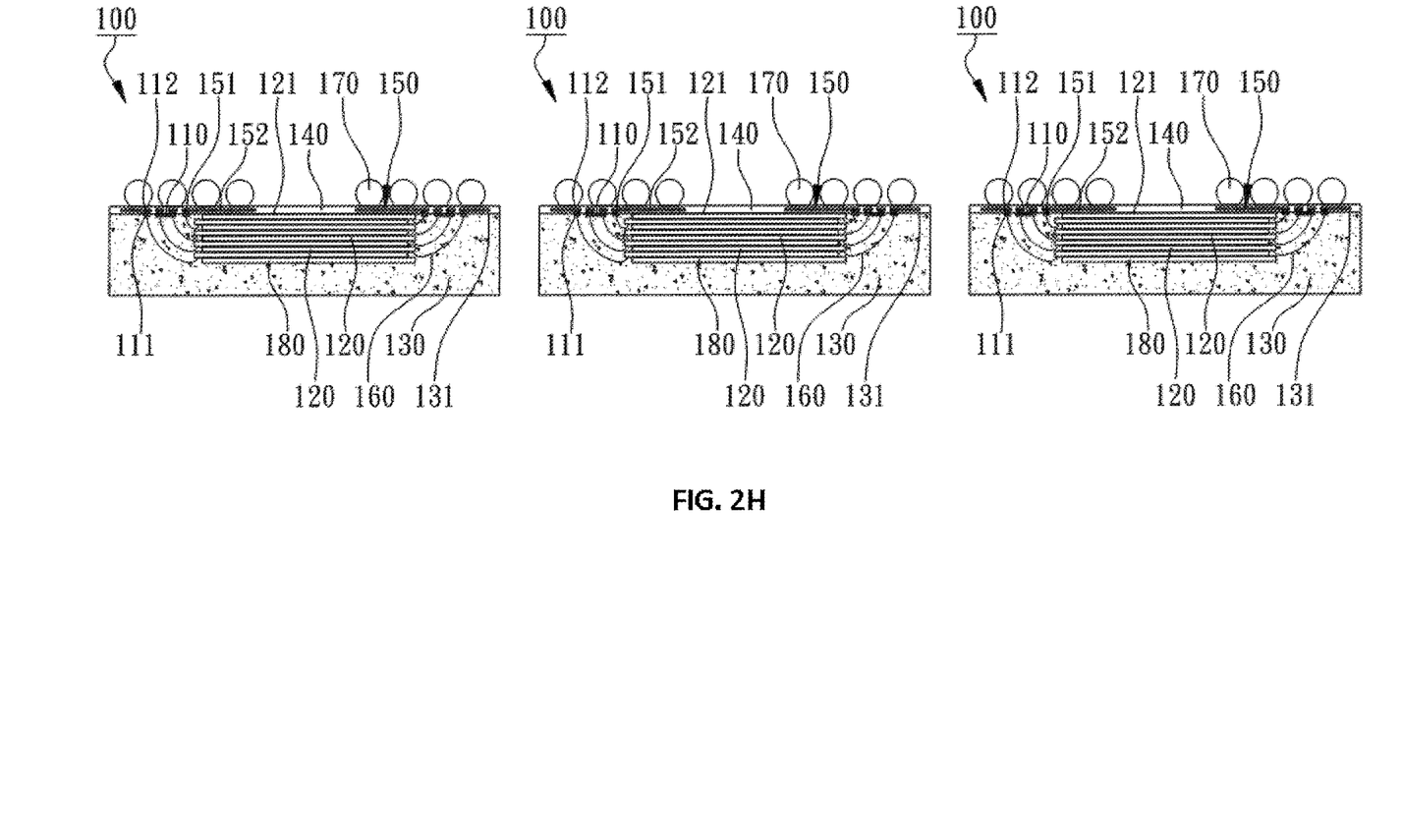

As shown in FIG. 2H, singulation cutting process or other back-end process is performed to form a plurality of individual fan-out multi-chip packages 100.

The above description of embodiments of this invention is intended to be illustrative but not limited. Other embodiments of this invention may be obvious to those skilled in the art in view of the above disclosure which still may be covered by and within the scope of the present invention even with any modifications, equivalent variations, and adaptations.

What is claimed is:

1. A fan-out multi-chip package, comprising:
a plurality of chips stacked on each other in a staggered stack arrangement;
a first redistribution layer formed on a periphery of the plurality of chips, the first redistribution layer having a plurality of first connecting points electrically connected to the plurality of chips and a plurality of connecting surfaces;
an encapsulant formed to encapsulate the plurality of chips and the first redistribution layer, the encapsulant having a bottom surface, wherein the bottom surface, the plurality of connecting surfaces of the first redistribution layer, and a back surface of one of the plurality of chips are coplanar to each other and forms a carrier plane;
a second redistribution layer formed on the carrier plane, the second redistribution layer being electrically connected to the first redistribution layer; and
a dielectric layer formed on the carrier plane and configured to cover the second redistribution layer.

2. The package as claimed in claim 1, further comprising a plurality of metal wires encapsulated by the encapsulant and configured to electrically connect the plurality of chips to the first connecting points.

3. The package as claimed in claim 1, wherein the plurality of chips has a first chip adjacent to a second chip, the second chip being laterally displaced from the first chip, and the second chip being stacked above the first chip without covering bond pads of the first chip.

4. The package as claimed in claim 1, wherein the plurality of chips has a plurality of first chips and a plurality of second chips, the plurality of first chips and the plurality of second chips are stacked to be alternating from one another, the plurality of first chips are vertically aligned to each other, and the plurality of second chips are vertically aligned to each other.

5. The package as claimed in claim 4, wherein when a first chip of the plurality of first chips is stacked on top of a second chip of the plurality of second chips, bond pads of the second chip is not covered by the first chip.

6. The package as claimed in claim 4, wherein when a second chip of the plurality of second chips is stacked on top of a first chip of the plurality of firstchips, bond pads of the first chip is not covered by the second chip.

7. The package as claimed in claim 1, further comprising a plurality of solder balls protruding from the dielectric layer and electrically connected to the second redistribution layer.

8. The package as claimed in claim 1, further comprising a protective plate stacked on an active surface of one of the plurality of chips.

9. The package as claimed in claim 1, further comprising a plurality of die attach layers, each of the plurality of die attach layers is formed between two chips of the plurality of chips.

10. The package as claimed in claim 1, wherein the back surface of one of the chips is completely covered by the dielectric layer.

* * * * *